United States Patent
Chang et al.

(10) Patent No.: US 11,521,050 B2
(45) Date of Patent: Dec. 6, 2022

(54) CONTROL CIRCUIT FOR MULTIPLY ACCUMULATE CIRCUIT OF NEURAL NETWORK SYSTEM

(71) Applicant: eMemory Technology Inc., Hsin-Chu (TW)

(72) Inventors: Chia-Fu Chang, Zhubei (TW); Cheng-Heng Chung, Zhubei (TW); Ching-Yuan Lin, Zhubei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 342 days.

(21) Appl. No.: 16/874,875

(22) Filed: May 15, 2020

(65) Prior Publication Data
US 2020/0372331 A1 Nov. 26, 2020

Related U.S. Application Data

(60) Provisional application No. 62/851,582, filed on May 22, 2019.

(51) Int. Cl.
G06N 3/063 (2006.01)
H01L 27/24 (2006.01)

(52) U.S. Cl.
CPC ......... *G06N 3/063* (2013.01); *H01L 27/2463* (2013.01)

(58) Field of Classification Search
CPC ..................................................... G06N 3/063
See application file for complete search history.

(56) References Cited

U.S. PATENT DOCUMENTS

| | | | | |
|---|---|---|---|---|
| 10,650,308 | B2* | 5/2020 | Ielmini | G06N 3/088 |
| 2012/0317063 | A1* | 12/2012 | Sim | G11C 13/003 |
| | | | | 706/27 |
| 2014/0289179 | A1* | 9/2014 | Di Castro | G06G 7/163 |
| | | | | 708/835 |
| 2017/0221558 | A1* | 8/2017 | Hu | G11C 13/0061 |
| 2018/0166134 | A1* | 6/2018 | Zidan | G11C 13/0007 |

FOREIGN PATENT DOCUMENTS

WO    WO2019100036 A1    5/2019

OTHER PUBLICATIONS

Danial, Loai; "Two-terminal floating-gate transistors with a low-power memristive operation mode for analogue neuromorphic computing"; Nature Electronics; Published Dec. 9, 2019 (Year: 2019).*
Ali Shafiee et al., ISAAC: A Convolutional Neural Network Accelerator with In-Situ Analog Arithmetic in Crossbars (Jun. 18, 2016).

* cited by examiner

*Primary Examiner* — Douglas King
(74) *Attorney, Agent, or Firm* — WPAT, PC

(57) ABSTRACT

A control circuit for a neural network system includes a first multiply accumulate circuit, a first neuron value storage circuit and a first processor. The first multiply accumulate circuit includes n memristive cells. The first terminals of the n memristive cells receive a supply voltage. The second terminals of the n memristive cells are connected with a first bit line. The control terminals of the n memristive cells are respectively connected with n word lines. Moreover, n neuron values of a first layer are stored in the first neuron value storage circuit. In an application phase, the first neuron value storage circuit controls the n word lines according to binary codes of the n neuron values. The first processor generates a first neuron value of a second layer.

14 Claims, 6 Drawing Sheets

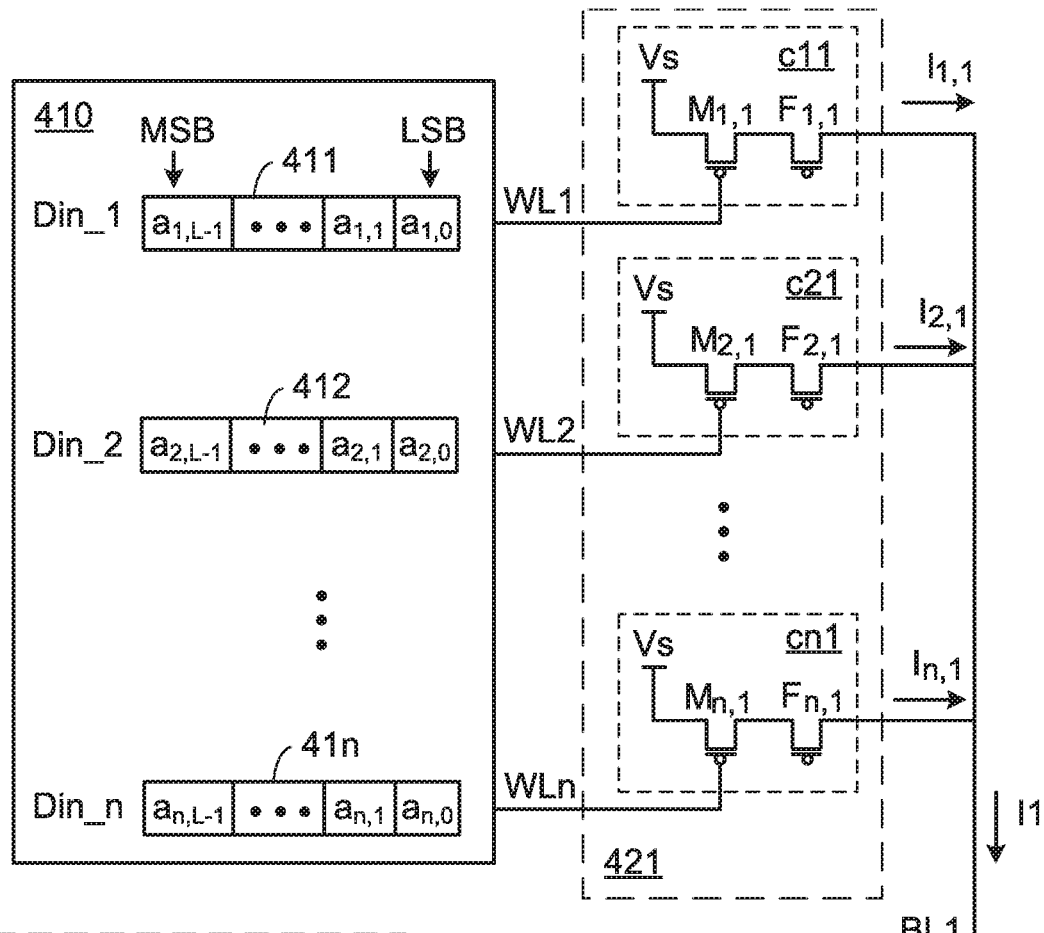
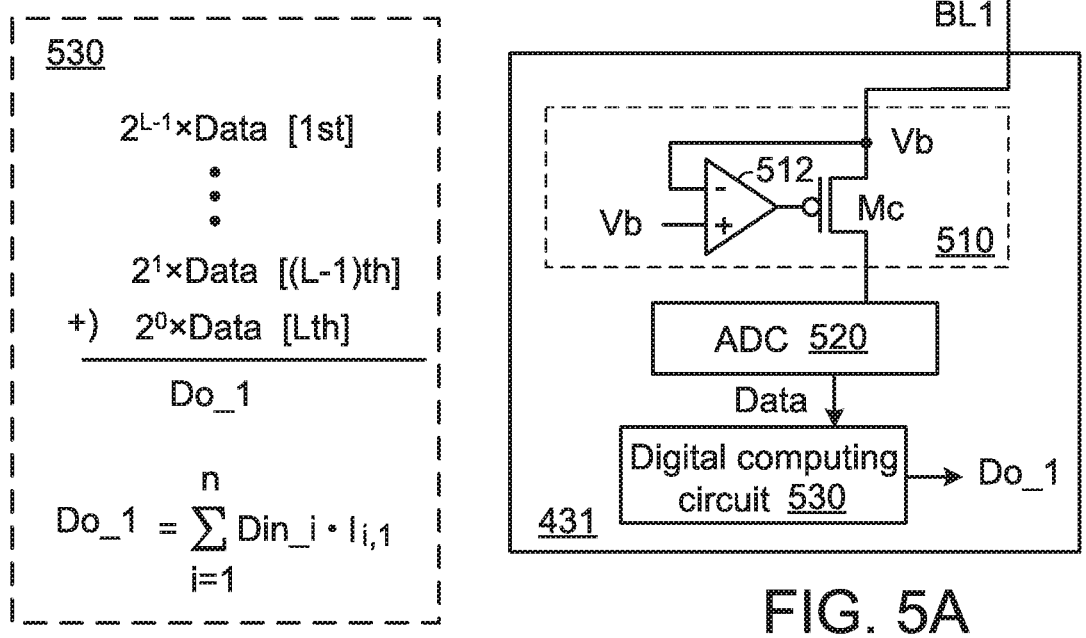
FIG. 5A
FIG. 5B

CONTROL CIRCUIT FOR MULTIPLY ACCUMULATE CIRCUIT OF NEURAL NETWORK SYSTEM

This application claims the benefit of U.S. provisional application Ser. No. 62/851,582, filed May 22, 2019, the subject matter of which is incorporated herein by reference.

APPLIED TO FIELD OF THE INVENTION

The present invention relates to a circuit for a neural network system, and more particularly to a control circuit for a multiply accumulate circuit of a neural network system.

BACKGROUND OF THE INVENTION

Recently, a neural network system has been widely applied to many AI application systems to provide the intelligent processing capability such as the pattern recognition capability, the data classification capability and the object detection capability. Hereinafter, a neural network system for recognizing numbers will be described.

FIG. 1 is a schematic diagram illustrating the architecture of a neural network system for recognizing numbers. The neural network system 100 is used for recognizing the handwritten numbers on a handwriting board 102. The handwriting board 102 is composed of 784 (=28×28) sensing points.

As shown in FIG. 1, the neural network system 100 comprises an input layer 110, a hidden layer 120 and an output layer 130. Generally, each sensing point on the handwriting board 102 corresponds to an input neuron of the input layer. Consequently, the input layer 110 comprises 784 (=28×28) input neurons $I_0$~$I_{783}$. It means that the size of the input layer 110 is 784.

Since the neural network system 100 has to recognize ten numbers 0~9, the output layer 130 comprises ten output neuron $O_0$~$O_9$. It means that the size of the output layer 130 is 10.

The hidden layer 120 of the neural network system 100 comprises 30 neurons $H_0$~$H_{29}$. That is, the size of the hidden layer 120 is 30. Consequently, the size of the neural network system 100 is indicated as 784-30-10.

Each connection line between the input layer 110 and the hidden layer 120 denotes a neuron connection weight. Similarly, each connection line between the hidden layer 120 and the output layer 130 also denotes a neuron connection weight. Please refer to FIG. 1. The neuron connection weights between the 784 input neurons $I_0$~$I_{783}$ of the input layer 110 and the neuron $H_0$ of the hidden layer 120 are indicated as $IH_{0,0}$~$IH_{783,0}$. Similarly, the neuron connection weights between the 784 input neurons $I_0$~$I_{783}$ of the input layer 110 and the 30 neurons $H_0$-$H_{29}$ of the hidden layer 120 are indicated as $IH_{0,0}$~$IH_{783,0}$ and $(IH_{0,1}$~$IH_{783,1})$~$(IH_{0,29}$~$IH_{783,29})$. Consequently, there are 734×30 neuron connection weights between the input layer 110 and the hidden layer 120.

The 30 neurons $H_0$-$H_{29}$ of the hidden layer 120 are connected with the ten output neurons $O_0$~$O_9$ of the output layer 130. Consequently, 30×10 neuron connection weights between the neurons $H_0$-$H_{29}$ of the hidden layer 120 and the output neuron $O_0$~$O_9$ of the output layer 130 are indicated as $(HO_{0,0}$~$HO_{29,0})$~$(HO_{0,9}$~$HO_{29,9})$. Moreover, the neuron connection weights $(IH_{0,0}$~$IH_{783,0})$~$(IH_{0,29}$~$IH_{783,29})$ and $(HO_{0,0}$~$HO_{29,0})$~$(HO_{0,9}$~$HO_{29,9})$ are collaboratively combined as a weight group.

After the values of the neurons of the previous layer are multiplied by the corresponding neuron connection weights and accumulated, the neuron values of the next layer are acquired. Take the neuron value Ho of the hidden layer 120 for example. The neuron value Ho of the hidden layer 120 is calculated by the following formula:

$$H_0 = I_0 \times IH_{0,0} + I_1 \times IH_{1,0} + \ldots + I_{783} \times IH_{783,0} = \sum_{i=0}^{783} I_i \times IH_{i,0}$$

The other neuron values $H_1$~$H_{29}$ of the hidden layer 120 also can be calculated by referencing the above formula.

Similarly, the output neuron value $O_0$ of the output layer 130 is calculated by the following formula:

$$O_0 = \sum_{j=0}^{29} H_j \times HO_{j,0}$$

The other output neuron values $O_1$~$O_9$ of the output layer 130 also can be calculated by referencing the above formula.

Before the practical applications of the neural network system 100, the neural network system 100 has to be in a training phase to acquire all neuron connection weights in the weight group. After all neuron connection weights in the weight group are acquired through many iterations of training, the well-trained neural network system 100 is established.

In an application phase, the number written on the handwriting board 102 can be recognized by the neural network system 100. As shown in FIG. 1, the number "7" is written on the handwriting board 102. Since the neuron $O_7$ of the output layer 130 has the highest value, the number "7" is recognized by the neural network system 100.

The example of the neural network system 100 as shown in FIG. 1 is presented herein for purpose of illustration and description only. In case that the neural network system is more complicated, the neural network system comprises plural hidden layers to increase the recognition capability. Moreover, the sizes of the hidden layers are not restricted.

Since the multiplication operation and the accumulation operation have to be performed on the neural network system continuously, the use of a computer system can execute the calculations about the multiplication operation and the accumulation operation. For example, all neuron connection weights are stored in the memory of the computer system. Then, a central processing unit (CPU) in the computer system accesses the neuron connection weights from the memory. After the multiplication operation and the accumulation operation are performed according to the neuron connection weights, all neuron values are acquired.

However, as the size of the neural network system is gradually increased, it is necessary to increase the storage capacity of the memory to store the neuron connection weights and the neuron values. Moreover, since the central processing unit has to access the data from the memory, the performance of the computer system is largely reduced and the power consumption of the computer system is increased.

Nowadays, according to the characteristics of the neural network system, a multiply accumulate circuit (also abbreviated as MAC) has been disclosed to calculate the neuron values Please refer to FIGS. 2A, 2B and 2C. FIG. 2A is a schematic diagram illustrating the architecture of a multiply accumulate circuit. FIG. 2B is a schematic circuit diagram illustrating a MAC group with plural multiply accumulate circuits. FIG. 2C is a schematic block diagram illustrating a control circuit.

In FIG. 2A, the multiply accumulate circuit 200 is shown. After the input values $X_1$~$X_n$ are multiplied by the corresponding weights $W_{1,j}$~$W_{n,j}$ and the products are accumulated, the output value $Y_j$ is acquired according to the following formula:

$$Yj = \sum_{i=1}^{n} X_i \times W_{i,j}$$

When the multiply accumulate circuit 200 is applied to the neural network system, the weights $W_{1,j}$~$W_{n,j}$ of the multiply accumulate circuit 200 are the neuron connection weights. Moreover, the input values are the neuron values of the previous layer, and the output value $Y_j$ is the neuron value of the next layer.

As shown in FIG. 2B, the MAC group 250 comprises plural multiply accumulate circuits 251~25j. The MAC group 250 is used to calculate the size n of the previous layer and the size j of the next layer in the neural network system.

Take the multiply accumulate circuit 251 for example. The multiply accumulate circuit 251 comprises n electrical conductance elements. The n electrical conductance elements have the conductance values $G_{1,1}$~$G_{n,1}$, respectively. Each electrical conductance element comprises a variable resistor. After the resistance value of the variable resistor is tuned, the reciprocal of the resistance value is the conductance value. For example, if the tuned resistance value is 5 ohms (Ω), the conductance value is 0.2 siemens (S). In addition, the conductance values $G_{1,1}$~$G_{n,1}$ are tuned according to the neuron connection weights of the neural network system.

Moreover, the n input terminals of the multiply accumulate circuit 251 receive n input voltages V1~Vn, respectively. The voltage values of the input voltages V1~Vn denote the neuron values of the previous layer. The output terminal of the multiply accumulate circuit 251 generates an output current I1. The output current I1 denotes the neuron value of the next layer. The electrical conductance elements $G_{1,1}$~$G_{n,m1}$ are connected between the n input terminals and the output terminal of the multiply accumulate circuit 251. The structure of each of the multiply accumulate circuits 252~25j is similar to the structure of the multiply accumulate circuit 251, and is not redundantly described herein.

In a training phase of the neural network system, the nxj conductance values $G_{1,1}$~$G_{n,j}$ of the multiply accumulate circuits 251~25j are tuned and used as nxj neuron connection weights.

In an application phase of the neural network system, the input terminals of the multiply accumulate circuits 251~25j receive the n input voltages V1~Vn, and the output terminals of the multiply accumulate circuits 251~25j are connected with a ground voltage (not shown). Consequently, the output currents I1~Ij from the multiply accumulate circuits 251~25j denote the j neuron values of the next layer.

For example, after the electrical conductance elements $G_{1,1}$~$G_{n,1}$ of the multiply accumulate circuit 251 receive the n input voltages V1~Vn, n currents $I_{1,1}$~$I_{n,1}$ are generated. The n currents $I_{1,1}$~$I_{n,1}$ are superposed into an output current I1 according to the following formula:

$$I1 = \sum_{i=1}^{n} I_{i,1} = \sum_{i=1}^{n} Vi \times G_{i,1}$$

As shown in FIG. 2C, the control circuit 290 comprises a digital-to-analog converter (DAC) 260, the MAC group 250 and an analog-to-digital converter (ADC) 270. The digital-to-analog converter 260 is used for converting digital values into analog voltages. The analog-to-digital converter 270 is used for converting analog currents into digital values.

Firstly, the n neuron values Din_1~Din_n of the previous layer are inputted into the digital-to-analog converter 260 and converted into the corresponding n input voltages V1~Vn. Then, the MAC group 250 receives the n input voltages V1~Vn and generates j output currents I1~Ij. Then, the j output currents I1~Ij are received by the analog-to-digital converter 270 and converted into j neuron values Do_1~Do_j of the next layer. The neuron values Din_1~Din_n and the neuron values Do_1~Do_j are digital values.

In other words, the neural network system of any size can be implemented with the control circuit 290 of FIG. 2C. For example, the size of the neural network system 100 as shown in FIG. 1 is indicated as 784-30-10.

Consequently, the neural network system 100 comprises two control circuits. The first control circuit receives the 784 neuron values $I_0$~$I_{783}$ of the input layer 110 and generates the 30 neuron values $H_0$~$H_{29}$ of the hidden layer 120. The second control circuit receives the 30 neuron values $H_0$~$H_{29}$ of the hidden layer 120 and generates the output neuron $O_0$~$O_9$ of the output layer 130.

SUMMARY OF THE INVENTION

The present invention provides a novel structure of a multiply accumulate circuit for a neural network system and an associated control circuit.

An embodiment of the present invention provides a control circuit for a neural network system. The control circuit includes a first multiply accumulate circuit, a first neuron value storage circuit and a first processor. The first multiply accumulate circuit includes n memristive cells. The first terminals of the n memristive cells receive a supply voltage. The second terminals of the n memristive cells are connected with a first bit line. The control terminals of the n memristive cells are respectively connected with n word lines. The first neuron value storage circuit is connected with the n word lines, and includes n registers. Moreover, n neuron values of a first layer are stored in the corresponding registers. The first processor is connected with the first bit line. In an application phase of the neural network system, the first neuron value storage circuit controls the n word lines according to binary codes of the n neuron values, so that the first multiply accumulate circuit generates plural first output currents to the first processor. The first processor generates a first neuron value of a second layer according to plural first output currents.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 5A is a schematic circuit diagram illustrating the operations of a processor of the control circuit according to the embodiment of the present invention;

FIG. 5B is a schematic circuit diagram illustrating the operations of a digital computing circuit of the processor as shown in FIG. 5A;

DETAILED DESCRIPTION OF PREFERRED EMBODIMENTS

As is well known, a memristor is an electric component with the characteristics of a resistor. Moreover, by providing a specified bias voltage to set the memristor, the memristor has a specified resistance value. After the specified bias voltage is not provided, the resistance value of the memristor is maintained at the specified resistance value and kept unchanged. For changing the resistance value of the memristor again, it is necessary to provide another bias voltage to the memristor. Generally, the memristor can be applied to a resistive random access memory (also abbreviated as RRAM or ReRAM), a non-volatile memory with a floating gate transistor or any other appropriate non-volatile memory.

Figure 1:
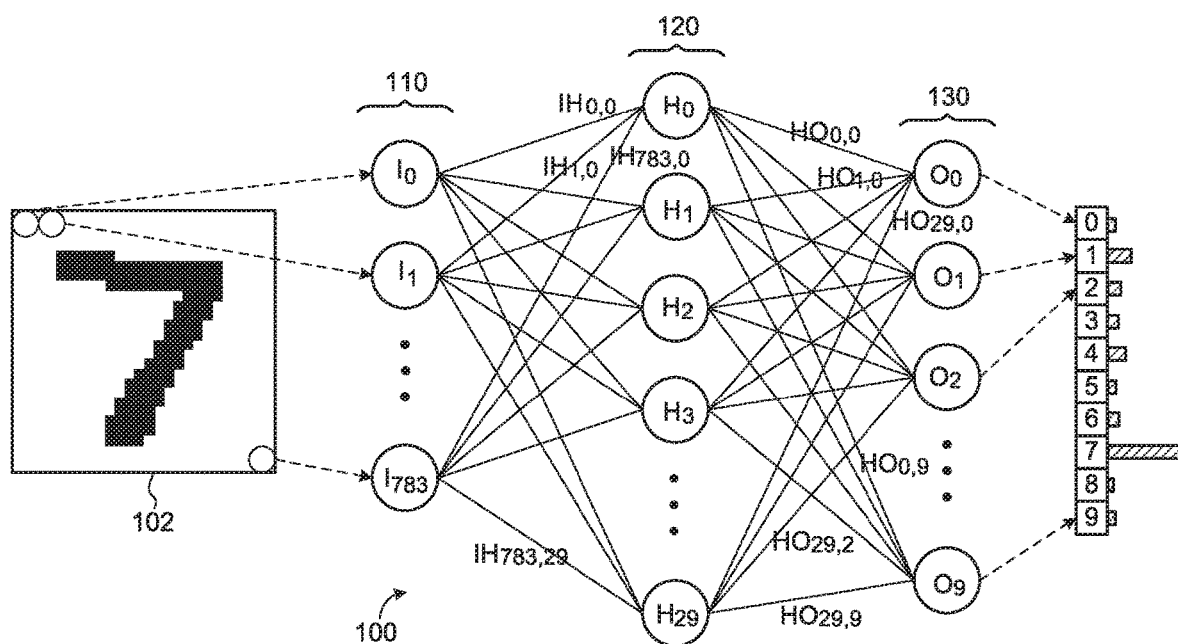
FIG. 1 (prior art) is a schematic diagram illustrating the architecture of a neural network system for recognizing numbers.
Figure 2A:
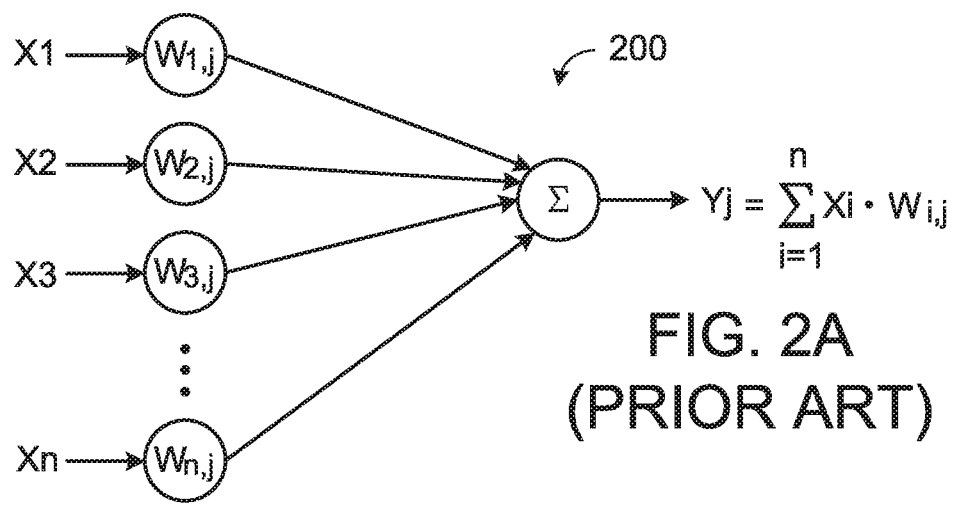
FIG. 2A (prior art) is a schematic diagram illustrating the architecture of a multiply accumulate circuit.
Figure 2B:
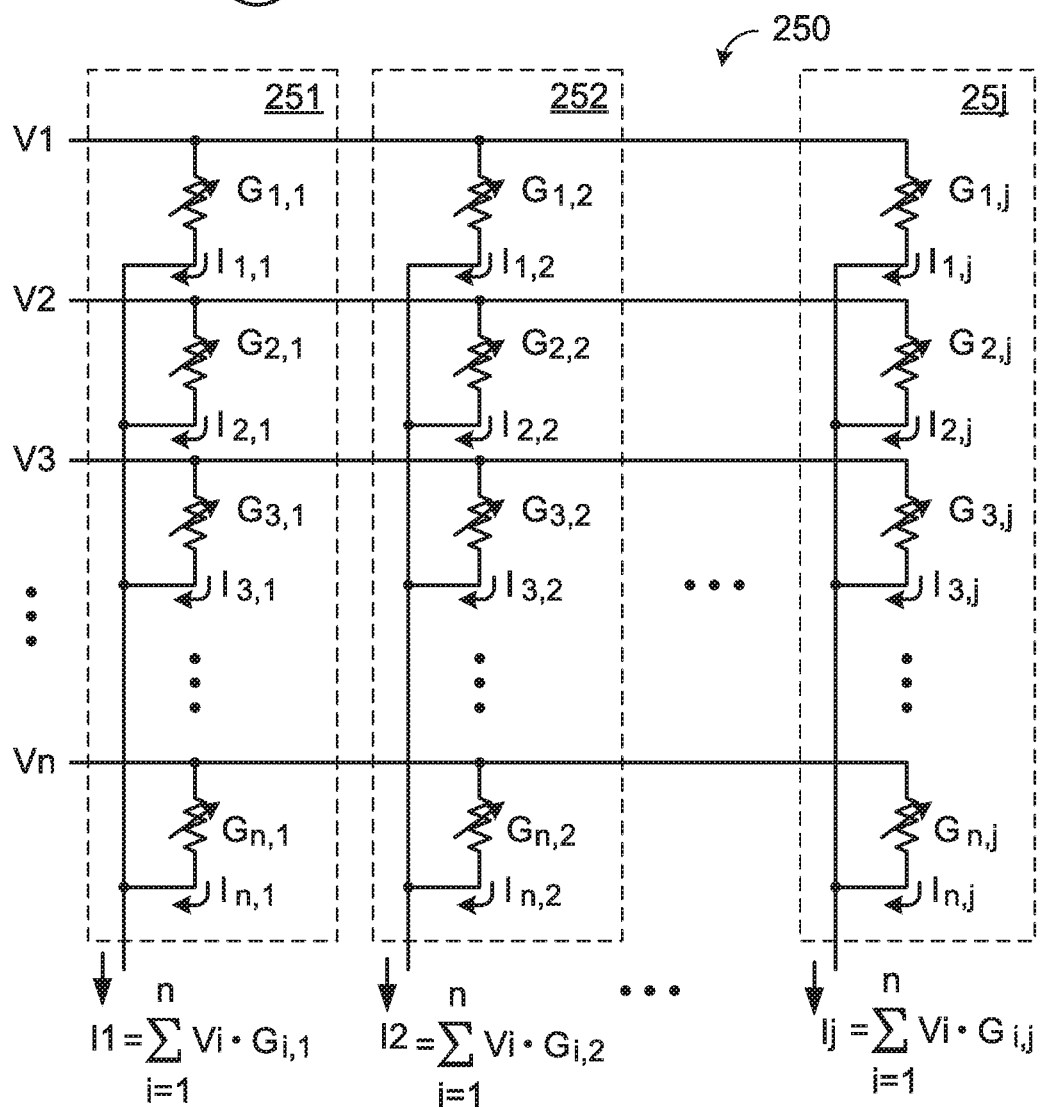
FIG. 2B (prior art) is a schematic circuit diagram illustrating a MAC group with plural multiply accumulate circuits.
Figure 2C:
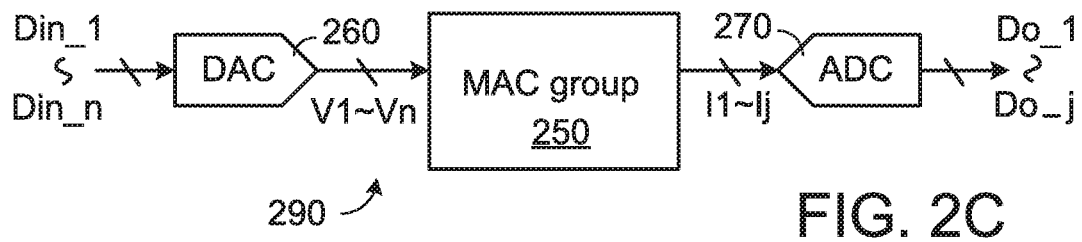
FIG. 2C (prior art) is a schematic block diagram illustrating a control circuit.
Figure 3A:
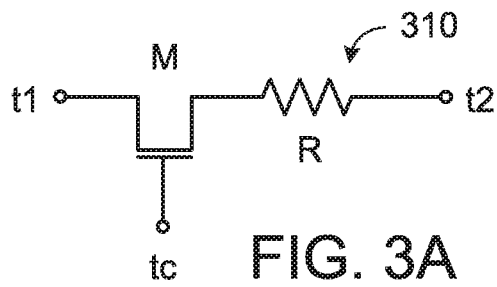
FIG. 3A is a schematic circuit diagram illustrates an example of a memristive cell.

FIG. 3A is a schematic circuit diagram illustrates an example of a memristive cell. As shown in FIG. 3A, the memristive cell 310 comprises a switch transistor M and a memristor R. A first drain/source terminal of the switch transistor M is used as a first terminal t1 of the memristive cell 310. A second drain/source terminal of the switch transistor M is connected with a first terminal of the memristor R. A second terminal of the memristor R is used as a second terminal t2 of the memristive cell 310. A gate terminal of the switch transistor M is used as a control terminal tc of the memristive cell 310. By providing proper bias voltages to the three terminals t1, t2 and tc of the memristive cell 310, the resistance value of the memristor R is correspondingly controlled.

In the memristive cell 310 as shown in FIG. 3A, the switch transistor M is an n-type transistor. In some other embodiments, the switch transistor M is a p-type transistor. Moreover, the memristor R may be implemented with an n-type floating gate transistor or a p-type floating gate transistor.

Figure 3B:
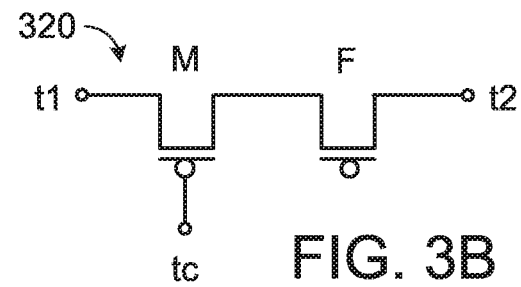
FIG. 3B is a schematic circuit diagram illustrates another example of a memristive cell.

FIG. 3B is a schematic circuit diagram illustrates another example of a memristive cell. As shown in FIG. 3B, the memristive cell 320 comprises a switch transistor M and a floating gate transistor F. A first drain/source terminal of the switch transistor M is used as a first terminal t1 of the memristive cell 320. A second drain/source terminal of the switch transistor M is connected with a first drain/source terminal of the floating gate transistor F. A second drain/source terminal of the floating gate transistor F is used as a second terminal t2 of the memristive cell 320. A gate terminal of the switch transistor M is used as a control terminal tc of the memristive cell 320. By providing proper bias voltages to the three terminals t1, t2 and tc of the memristive cell 320, a specified amount of hot carriers are injected into the floating gate. Consequently, the internal resistance value of the floating gate transistor F is correspondingly controlled.

Moreover, plural memristive cells 310, plural memristive cells 320 or other types of memristive cells may be collaboratively formed as a cell array.

Figure 3C:
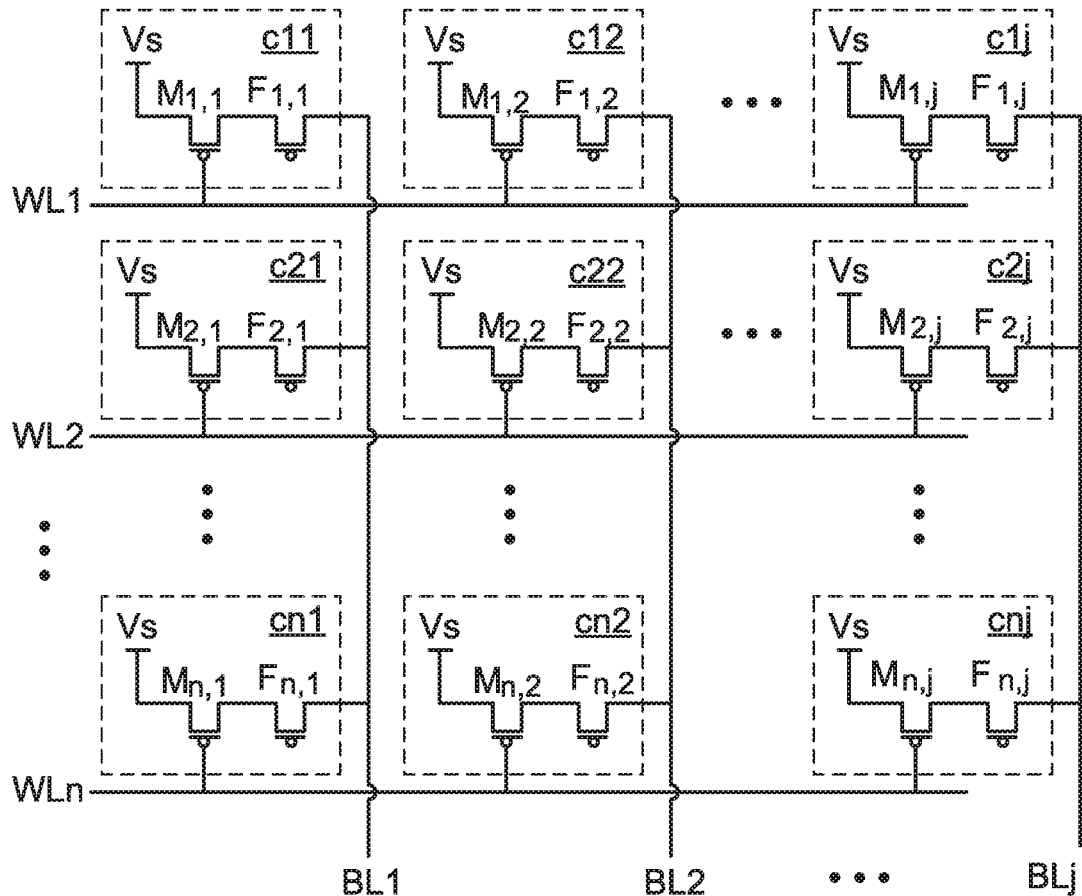
FIG. 3C is a schematic circuit diagram illustrating a cell array with plural memristive cells.

FIG. 3C is a schematic circuit diagram illustrating a cell array with plural memristive cells. As shown in FIG. 3C, the cell array comprises plural memristive cells 320 as shown in FIG. 3B. The cell array 350 comprises nxj memristive cells c11~cnj. The memristive cells c11~cnj comprises respective switch transistors $M_{1,1}$~$M_{n,j}$ and respective floating gate transistors $F_{1,1}$~$F_{n,j}$. The structure of each of the memristive cells c11~cnj is similar to the structure of the memristive cell 320 as shown in FIG. 3B, and is not redundantly described herein. The first terminals of all memristive cells c11~cnj receive a supply voltage Vs.

The control terminals of the first row of j memristive cells C11~c1j in the cell array 350 are connected with a word line WL1. The second terminals of the memristive cells C11~c1j are connected with the corresponding bit lines BL1~BLj, respectively. The control terminals of the second row of j memristive cells c21~c2j in the cell array 350 are connected with a word line WL2. The second terminals of the memristive cells c21~c2j are connected with the corresponding bit lines BL1~BLj, respectively. The rest may be deduced by analog.

The cell array 350 can be applied to a non-volatile memory to store or receive data. During a program action or a read action of the non-volatile memory, one of the n word lines WL1~WLn in the cell array 350 is activated and the other word lines are inactivated. For example, during the program action, the word line WL1 is activated. Meanwhile, various bias voltages are provided to the bit lines BL1~BLj, and different amounts of hot carriers are injected into the floating gates of the floating gate transistors of the j memristive cells C11~c1j. Consequently, the internal resistance values of the floating gate transistors are correspondingly controlled.

In accordance with a feature of the present invention, a multiply accumulate circuit is implemented with the cell array 350 as shown in FIG. 3C. Moreover, the way of controlling the cell array 350 is specially designed. That is, the cell array and other circuits collaboratively work to form a control circuit in order to define the multiply accumulate circuit of a neural network system.

Figure 4:
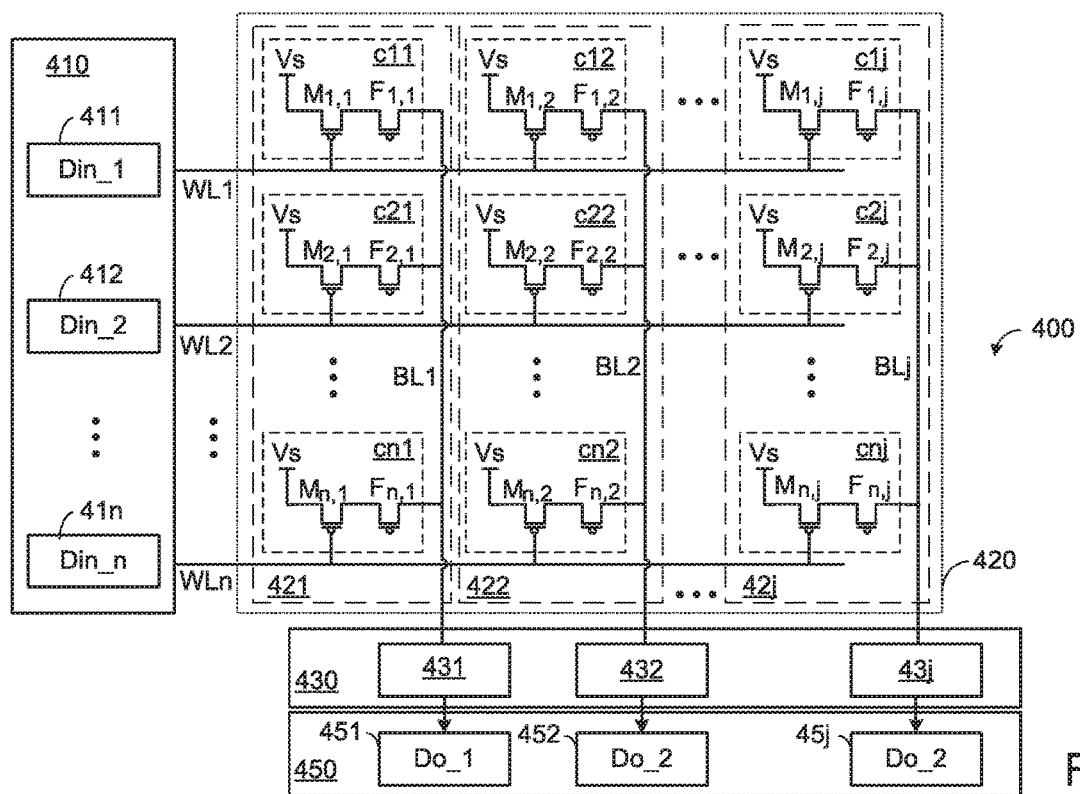
FIG. 4 is a schematic circuit diagram illustrating a control circuit according to an embodiment of the present invention.

FIG. 4 is a schematic circuit diagram illustrating a control circuit according to an embodiment of the present invention. As shown in FIG. 4, the control circuit 400 comprises a first neuron value storage circuit 410, a cell array 420, a processing circuit 430 and a second neuron value storage circuit 450.

The first neuron value storage circuit 410 comprises n registers 411~41n. The n registers 411~41n store n neuron values Din_1~Din_n of the previous layer. The n neuron values Din_1~Din_n are digital values.

The cell array 420 comprises nxj memristive cells c11~cnj. The structure of each of the memristive cells c11~cnj is similar to the structure of the memristive cell 320 as shown in FIG. 3B, and is not redundantly described herein. Alternatively, the structure of each of the memristive cells is similar to the structure of the memristive cell 310. Take the memristive cell c11 for example. The memristive cell c11 comprises a switch transistor $M_{1,1}$ and a floating gate transistor $F_{1,1}$. A first terminal of the memristive cell c11 receives the supply voltage Vs. A second terminal of the memristive cell c11 is connected with the bit line BL1. A control terminal of the memristive cell c11 is connected with the word line WL1.

The n word lines WL1~WLn of the cell array 420 are connected with the first neuron value storage circuit 410. Moreover, each column of n memristive cells in the cell array 420 are defined as a multiply accumulate circuit. That is, the cell array 420 comprises j multiply accumulate circuits 421~42j. The j multiply accumulate circuits 421~42j are connected with the n word lines WL1~WLn. Moreover, the j multiply accumulate circuits 421~42j are connected with the corresponding bit lines BL1~BLj, respectively. For example, the multiply accumulate circuit 421 comprises n memristive cells c11~cn1. The first terminals of the n memristive cells c11~cn1 receive the supply voltage Vs. The second terminals of the n memristive cells c11~cn1 are connected with the bit line BL1. The control terminals of the n memristive cells c11~cn1 are connected with the corresponding word lines WL1~WLn, respectively. The structures of the multiply accumulate circuits 422~42j are similar to the structure of the multiply accumulate circuit 421, and are not redundantly described herein.

The processing circuit 430 comprises j processors 431~43j. The j processors 431~43j are connected with the corresponding bit lines BL1~BLj, respectively. The second neuron value storage circuit 450 is connected with the processing circuit, and the second neuron value storage circuit 450 comprises j registers 451~45j. The j registers 451~45j store the neuron values Do_1~Do_j of the next layer. The j neuron values Do_1~Do_j are digital values In this embodiment, the word lines WL1~WLn of the cell array 420 are operated according to the n neuron values Din_1~Din_n. That is, it is not necessary to converter the n neuron values Din_1~Din_n through the digital-to-analog converter (DAC). Especially, the word lines WL1~WLn of the cell array 420 are selectively activated or inactivated according to the binary codes of the neuron values Din_1~Din_n. In other words, two or more than two word lines of the word lines WL1~WLn of the cell array 420 are activated simultaneously Since the neuron values Din_1~Din_n are digital values, the multiply accumulate circuits 421~42j perform multiple operations according to the bit numbers of the neuron values Din_1~Din_n. For example, if the neuron values Din_1~Din_n are 8-bit digital values, the multiply accumulate circuits 421~42j perform eight operations and generate output currents to the corresponding bit lines BL1~BLj for eight times.

Moreover, the processors 431~43j of the processing circuit 430 receive the output currents from the corresponding bit lines BL1~BLj for many times. After the processors 431~43 perform calculations, the neuron values Do_1~Do_j are generated and transmitted to the j registers 451~45j of the second neuron value storage circuit 450, respectively.

For brevity, the operations of the multiply accumulate circuit 421 and the corresponding processor 431 will be described as follows.

FIG. 5A is a schematic circuit diagram illustrating the operations of a processor of the control circuit according to the embodiment of the present invention. FIG. 5B is a schematic circuit diagram illustrating the operations of a digital computing circuit of the processor as shown in FIG. 5A. As shown in FIG. 5A, the processor 431 comprises a voltage clamping circuit 510, an analog-to-digital converter (ADC) 520 and a digital computing circuit 530. The analog-to-digital converter 520 is connected with the voltage clamping circuit 510. The analog-to-digital converter 520 receives the analog output current I1 and converts the analog output current I1 into a digital output data Data.

The voltage clamping circuit 510 comprises a control transistor Mc and an operation amplifier 512. A first drain/source terminal of the control transistor Mc is connected with the bit line BL1. The second drain/source terminal of the control transistor Mc is connected with an input terminal of the analog-to-digital converter 520. A positive input terminal of the operation amplifier 512 receives a bias voltage Vb. A negative input terminal of the operation amplifier 512 is connected with the first drain/source terminal of the control transistor Mc. An output terminal of the operation amplifier 512 is connected with a gate terminal of the control transistor Mc. Consequently, during the operation of the multiply accumulate circuit 421, the voltage of the bit line BL1 is fixed at the bias voltage Vb.

In some embodiments, the processor 431 is not equipped with the voltage clamping circuit 510. Under this circumstance, the input terminal of the analog-to-digital converter 520 is connected with the bit line BL1. The analog-to-digital converter 520 receives the analog output current I1 and converts the analog output current I1 into a digital output data Data.

In a training phase of the neural network system, the internal resistance values of the n floating gate transistors $F_{1,1}$~$F_{n,1}$ of the multiply accumulate circuit 421 are tuned. For example, the internal resistance values of the floating gate transistors $F_{1,1}$~$F_{n,1}$ are tuned to $r_{1,1}$~$r_{n,1}$, respectively. When the word line WL1 is activated, the switch transistor The $M_{1,1}$ of the memristive cell c11 is turned on. Consequently, the cell current $I_{1,1}$ generated by the memristive cell c11 is equal to $[(Vs-Vb)/r_{1,1}]$. In addition, the cell current $I_{1,1}$ denotes the corresponding neuron connection weight. Similarly, the other memristive cells c21~cn1 of the multiply accumulate circuit 421 generate the cell currents $I_{2,1}$~$I_{n,1}$ as the corresponding neuron connection weights.

In case that the word line WL1 is inactivated, the memristive cell c11 does not generate the cell current $I_{1,1}$. That is, $I_{1,1}$=0. Similarly, in case that the word lines WL2~WLn are inactivated, the corresponding memristive cells c21~cn1 do not generate the cell currents $I_{2,1}$~$I_{n,1}$.

In an application phase of the neural network system, the multiply accumulate circuit 421 performs multiple operations according to the bit numbers of the neuron values Din_1~Din_n. Whenever one operation is performed, an output current I1 is generated to the processor 431. According to the output current I1 generated at each time, the processor 431 generates the neuron values Do_1.

For example, the neuron values Din_1~Din_n are 8-bit values. The first neuron value storage circuit 410 successively provides one bit of the neuron values Din_1~Din_n to control the corresponding word lines WL1~WLn. Consequently, the memristive cells c11~c1j of the multiply accumulate circuit 421 generates the cell currents $I_{1,1}$~$I_{n,1}$. The output current I1 that is equal to the total of the cell currents $I_{1,1}$~$I_{n,1}$ is outputted to the processor 431 through the bit line BL1. Since the neuron values Din_1~Din_n are 8-bit values, the first neuron value storage circuit 410 generates a total of eight output currents I1 to the processor 431. The eight output currents 11 are sequentially converted into eight output data Data by the analog-to-digital converter 520. After the digital computing circuit 530 performs calculations on the eight output data Data, the neuron values Do_1 is generated.

Similarly, in case that the neuron values Din_1~Din_n are L-bit values, the first neuron value storage circuit 410 generates a total of L output currents I1 to the processor 431. The L output currents 11 are sequentially converted into eight output data Data by the analog-to-digital converter 520. After the digital computing circuit 530 performs calculations on the L output data Data, the neuron values Do_1 is generated.

A method of performing the calculations by the multiply accumulate circuit 421 will be described in more details as follows.

Firstly, the first neuron value storage circuit 410 successively provides one bit of the neuron values Din_1~Din_n in the registers 411~41n to control the corresponding word lines WL1~WLn.

Take the register 411 for example. An L-bit neuron value Din_1 is stored in the register 411. The binary codes of the L-bit neuron value Din_1 contain the bits $a_{1,L-1}$, . . . , $a_{1,1}$, $a_{1,0}$ from the most significant bit (MSB) to the least significant bit (LSB) sequentially. If the binary code is "1", the word line WL1 is activated and the switch transistor $M_{1,1}$ is turned on. Consequently, the memristive cell c11 generates the cell current $I_{1,1}$. Whereas, if the binary code is "0", the word line WL1 is inactivated and the switch transistor $M_{1,1}$ is turned off. Consequently, the memristive cell c11 does not generate the cell current $I_{1,1}$. It is noted that control method is not restricted. For example, in another embodiment, the word line WL1 is activated if the binary code is "0", and the word line WL1 is inactivated if the binary code is "1".

During a first operation of the multiply accumulate circuit 421, the first neuron value storage circuit 410 provides the most significant bits (MSB) in the registers 411~41n to control the corresponding word lines WL1~WLn. That is, the first neuron value storage circuit 410 controls the word line WL1 according to the bit "$a_{1,L-1}$" in the register 411, and the first neuron value storage circuits 410 control the word line WL2 according to the bit "$a_{2,L-1}$" in the register 412. The rest may be deduced by analogy. The first neuron value storage circuit 410 controls the word line WLn according to the bit "$a_{n,L-1}$" in the register 41n. Consequently, in the first operation, the output current I1 generated by the multiply accumulate circuit 421 may be expressed by the following formula:

$$I1 = a_{1,L-1} \cdot I_{1,1} + a_{2,L-1} \cdot I_{2,1} + \ldots + a_{n,L-1} \cdot I_{n,1} = \sum_{i=1}^{n} a_{i,L-1} \times I_{i,1}$$

Then, the output current I1 is converted into a first output data Data by the analog-to-digital converter 520. The first output data Data is transmitted to the digital computing circuit 530.

Please refer to FIG. 5B. Since the first neuron value storage circuit 410 provides the most significant bits (MSB) in the registers 411~41n, the power is equal to (L−1). Then, the digital computing circuit 530 multiplies the first output data Data [1st] by $2^{L-1}$. That is, the following formula is obtained:

$$2^{L-1} \times \text{Data} = 2^{L-1} \times \sum_{i=1}^{n} a_{i,L-1} \times I_{i,1}$$

The rest may be deduced by analogy. During the second last (i.e., the (L−1)-th) operation of the multiply accumulate circuit 421, the first neuron value storage circuit 410 provides the second bits in the registers 411~41n to control the corresponding word lines WL1~WLn. That is, the first neuron value storage circuit 410 controls the word line WL1 according to the bit "all" in the register 411, and the first neuron value storage circuits 410 control the word line WL2 according to the bit "$a_{2,1}$" in the register 412. The rest may be deduced by analogy. The first neuron value storage circuit 410 controls the word line WLn according to the bit "$a_{n,1}$" in the register 41n. Consequently, in the (L−1)-th operation, the output current I1 generated by the multiply accumulate circuit 421 may be expressed by the following formula:

$$I1 = a_{1,1} \cdot I_{1,1} + a_{2,1} \cdot I_{2,1} + \ldots + a_{n,1} \cdot I_{n,1} = \sum_{i=1}^{n} a_{i,1} \times I_{i,1}$$

Then, the output current I1 is converted into an (L−1)-th output data Data [(L−1)-th] by the analog-to-digital converter 520. The (L−1)-th output data Data [(L−1)-th] is transmitted to the digital computing circuit 530.

Please refer to FIG. 5B. Since the first neuron value storage circuit 410 provides the second bits in the registers 411~41n, the power is equal to 1. Then, the digital computing circuit 530 multiplies the (L−1)-th output data Data [(L−1)-th] by $2^1$. That is, the following formula is obtained:

$$2^1 \times \text{Data} = 2^1 \times \sum_{i=1}^{n} a_{i,1} \times I_{i,1}$$

During the last (i.e., the L-th) operation of the multiply accumulate circuit 421, the first neuron value storage circuit 410 provides the least significant bits (LSB) in the registers 411~41n to control the corresponding word lines WL1~WLn. That is, the first neuron value storage circuit 410 controls the word line WL1 according to the bit "$a_{1,0}$" in the register 411, and the first neuron value storage circuits 410 control the word line WL2 according to the bit "$a_{2,0}$" in the register 412. The rest may be deduced by analogy. The first neuron value storage circuit 410 controls the word line WLn according to the bit "$a_{n,0}$" in the register 41n. Consequently, in the L-th operation, the output current I1 generated by the multiply accumulate circuit 421 may be expressed by the following formula:

$$I1 = a_{1,0} \cdot I_{1,1} + a_{2,0} \cdot I_{2,1} + \ldots + a_{n,0} \cdot I_{n,1} = \sum_{i=1}^{n} a_{i,0} \times I_{i,1}$$

Then, the output current I1 is converted into a last output data Data [Lth] by the analog-to-digital converter 520. The last output data Data [Lth] is transmitted to the digital computing circuit 530.

Please refer to FIG. 5B. Since the first neuron value storage circuit 410 provides the least significant bits (LSB) in the registers 411~41n, the power is equal to 0. Then, the digital computing circuit 530 multiplies the last output data Data [L-th] by $2^0$. That is, the following formula is obtained $$2^0 \times \text{Data} = 2^0 \times \sum_{i=1}^{n} a_{i,0} \times I_{i,1}$$

Please refer to FIG. 5B again. After the above formulae about the product of the output data and the corresponding power of 2 are accumulated by the digital computing circuit 530, the neuron value Do_1 of the next layer may be expressed by the following formula:

$$\text{Do}\_1 = \sum_{b=0}^{L-1} 2^b \times \left[\sum_{i=1}^{n} a_{i,b} \times I_{i,1}\right] = \sum_{i=1}^{n} \left(\sum_{b=0}^{L-1} a_{i,b} \times 2^b\right) \times I_{i,1} = \sum_{i=1}^{n} \text{Din}\_i \times I_{i,1}$$

The operations of the multiply accumulate circuits 422~42j and the processors 432~43j are similar.

That is, the neuron value Do_2 of the next layer may be expressed by the following formula:

$$\text{Do}\_2 = \sum_{i=1}^{n} \text{Din}\_i \times I_{i,2}$$

The rest may be deduced by analogy. The neuron value Do_j of the next layer may be expressed by the following formula:

$$\text{Do}\_j = \sum_{i=1}^{n} \text{Din}\_i \times I_{i,j}$$

In other words, the control circuit 400 can acquire the j neuron values Do_~Do_j of the next layer according to multiplication results of the n neuron values Din_1~Din_n of the previous layer and the corresponding neuron connection weights $I_{1,1}$~$I_{n,j}$.

Figure 6A:
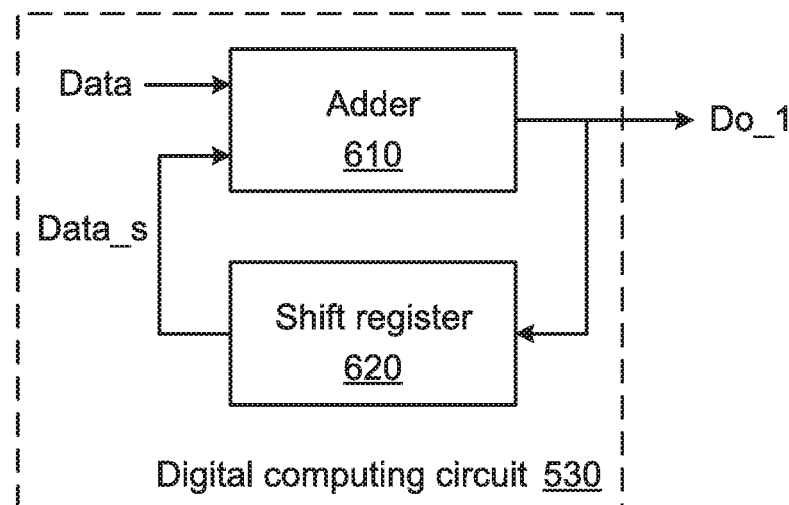
FIG. 6A is a schematic circuit block diagram illustrating a digital computing circuit of the control circuit according to the embodiment of the present invention.

In an embodiment, the digital computing circuit 530 is implemented with a shift register. FIG. 6A is a schematic circuit block diagram illustrating a digital computing circuit of the control circuit according to the embodiment of the present invention. As shown in FIG. 6A, the digital computing circuit 530 comprises an adder 610 and a shift register 620. For example, the shift register 620 is a shift left register. A first input terminal of the adder 610 receives the output data Data. A second input terminal of the adder 610 is connected with an output terminal of the shift register 620. An output terminal of the adder 610 is connected with an input terminal of the shift register 620.

After the adder 610 receives the first output data Data, the accumulated value is inputted into the shift register 620. In addition, the accumulated value Data is shifted left for one bit by the shift register 620, and thus a shifted data Data_s is generated. That is, the accumulated value of the adder 610 is multiplied by 2.

After the adder 610 receives the second output data Data, the second output data Data and the shifted data Data_s from the shift register 620 are added. In addition, the accumulated value is shifted left for one bit by the shift register 620, and thus the shifted data Data_s is generated. The rest may be deduced by analogy. After the L-th output data Data is received by the adder 610, the accumulated value outputted from the adder 610 is the neuron value Do_1.

In case that the first neuron value storage circuit 410 successively provides the bits from the least significant bit (LSB) to the most significant bit (MSB), the shift register 620 of the digital computing circuit 530 is a shift right register.

Figure 6B:
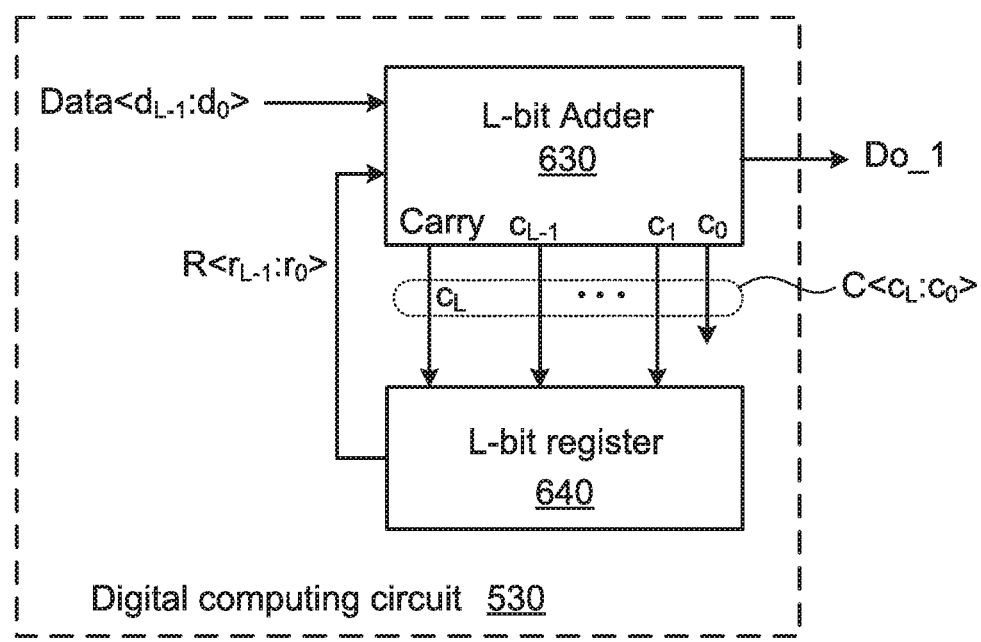
FIG. 6B is a schematic circuit block diagram illustrating another digital computing circuit.

The digital computing circuit 530 shown in FIG. 6A can generate the digital value as the neuron value Do. In some embodiments, a simplified digital computing circuit can be used to calculate a digital value as the neuron value Do. FIG. 6B is a schematic circuit block diagram illustrating another digital computing circuit of the present invention.

As shown in FIG. 6B, the digital computing circuit 530 comprises a L-bit adder 630 and a L-bit register 640. The L-bit adder 630 is capable of adding two L-bit data (i.e. Data<$d_{L-1}$:$d_0$> and R<$r_{L-1}$:$d_0$>) and generating a (L+1)-bit data (i.e. C<$c_L$:$c_0$>) including one carry bit. That is, a first input terminal of the adder 630 receives the output data Data<$d_{L-1}$:$d_0$> from the analog-to-digital converter 520. A second input terminal of the adder 630 receives a registered data R<$r_{L-1}$:$r_0$> from the L-bit register 640. An output terminal of the adder 630 generates an accumulated data C<$c_L$:$c_0$>.

According to the embodiment of the present invention, the L-bit register 640 receives a portion of the accumulated data C<$c_L$:$c_0$>. Actually, the first L bits of the accumulated data C<$c_L$:$c_1$> is received by the L-bit register 640 as the registered data R<$r_{L-1}$:$r_0$>, and the least significant bit (LSB) of the accumulated data <$c_0$> is discarded.

In case that the first neuron value storage circuit 410 successively provides the bits from the least significant bit (LSB) to the most significant bit (MSB). After the L-bit adder 630 receives the first output data Data<$d_{L-1}$:$d_0$>, a portion of the accumulated data C<$c_L$:$c_1$> is inputted into the L-bit register 640 as the registered data R<$r_{L-1}$:$r_0$>.

Then, after the adder 630 receives the second output data Data<$d_{L-1}$:$d_0$>, the second output data Data<$d_{L-1}$:$d_0$> and the registered data R<$r_{L-1}$:$r_0$> from the L-bit register 640 are added to generate the accumulated data C<$c_L$:$c_0$>. In addition, a portion of the accumulated data C<$c_L$:$c_1$> is inputted into the L-bit register 640 as the registered data R<$r_{L-1}$:$r_0$>. The rest may be deduced by analogy. After the L-th output data Data is received by the L-bit adder 630, the accumulated data C<$c_{L-1}$:$c_0$> outputted from the L-bit adder 630 is the neuron value Do_1 if the carry bit cL equals 0 while the accumulated data C<$c_L$:$c_1$> outputted from the L-bit adder 630 is the neuron value Do_1 if the carry bit $c_L$ equals 1.

From the above descriptions, the present invention provides a multiply accumulate circuit for a neural network system and an associated control circuit. In the control circuit, the binary codes of the neuron values Din_1~Din_n of the previous layer are sequentially provided to control the multiply accumulate circuits 421~42j of the cell array 420. Moreover, the processing circuit 430 receives the output currents from the multiply accumulate circuits 421~42j and generates the neuron values Do_1~Do_j of the next layer.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control circuit for a neural network system, the control circuit comprising:
   a first multiply accumulate circuit comprising n memristive cells, wherein first terminals of the n memristive cells receive a supply voltage, second terminals of the n memristive cells are connected with a first bit line, and control terminals of the n memristive cells are respectively connected with n word lines;
   a first neuron value storage circuit connected with the n word lines, and comprising n registers, wherein n neuron values of a first layer are stored in the corresponding registers, the n neuron values of the first layer are binary codes, and the binary codes are L-bit values; and
   a first processor connected with the first bit line;
   wherein in an application phase of the neural network system, the first neuron value storage circuit is configured to sequentially provide one bit of the n neuron values for L times to control the n word lines of the first multiply accumulate circuit, the first multiply accumulate circuit is configured to generate a first output currents for L times to the first processor through the first bit line, wherein the first processor is configured to generates a first neuron value of a second layer according to L first output currents outputted by the first multiply accumulate circuit.

2. The control circuit as claimed in claim 1, wherein a first memristive cell of the n memristive cell comprises a switch transistor and a memristor, wherein a gate terminal of the switch transistor is used as the control terminal of the first memristive cell, a first drain/source terminal of the switch transistor is used as the first terminal of the first memristive cell, a second drain/source terminal of the switch transistor is connected with a first terminal of the memristor, and a second terminal of the memristor is used as the second terminal of the first memristive cell.

3. The control circuit as claimed in claim 2, wherein the memristor is a floating gate transistor, wherein a first drain/source terminal of the floating gate transistor is connected with the second drain/source terminal of the switch transistor, and a second drain/source terminal of the floating gate transistor is used as the second terminal of the first memristive cell.

4. The control circuit as claimed in claim 2, wherein in a training phase of the neural network system, a resistance value of the memristor is tuned.

5. The control circuit as claimed in claim 4, wherein a neuron connection weight is adjusted according to the tuned resistance value.

6. The control circuit as claimed in claim 2, further comprises:
   a second multiply accumulate circuit comprising n memristive cells, wherein first terminals of the n memristive cells receive the supply voltage, second terminals of the n memristive cells are connected with a second bit line, and control terminals of the n memristive cells are respectively connected with n word lines;
   a processing circuit comprising the first processor and a second processor, wherein the second processor is connected with the second bit line, wherein in the application phase of the neural network system, the first neuron value storage circuit controls the n word lines according to the binary codes of the n neuron values, the second multiply accumulate circuit is configured to generate plural second output currents to the second processor, wherein the second processor is configured to generates a second neuron value of the second layer according to plural second output currents; and
   a second neuron value storage circuit comprising a first register and a second register, wherein the first register is connected with the first processor to store the first neuron value of the second layer, and the second register is connected with the second processor to store the second neuron value of the second layer.

7. The control circuit as claimed in claim 1, wherein the first processor comprises:
   an analog-to-digital converter configured to receive and convert the L first output currents into L output data; and
   a digital computing circuit configured to generate the first neuron value of the second layer according to the L output data.

8. The control circuit as claimed in claim 7, wherein after the products of the L output data and the power of 2 are accumulated, the first neuron value of the second layer is acquired.

9. A control circuit for a neural network system, the control circuit comprising:
   a first multiply accumulate circuit comprising n memristive cells, wherein first terminals of the n memristive cells receive a supply voltage, second terminals of the n memristive cells are connected with a first bit line, and control terminals of the n memristive cells are respectively connected with n word lines;
   a first neuron value storage circuit connected with the n word lines, and comprising n registers, wherein n neuron values of a first layer are stored in the corresponding registers, the n neuron values of the first layer are binary codes, and the binary codes are L-bit values; and
   a first processor connected with the first bit line;
   wherein in an application phase of the neural network system, the first neuron value storage circuit is configured to sequentially provide one bit of the n neuron values for L times to control the n word lines of the first multiply accumulate circuit, the first multiply accumulate circuit is configured to generate a first output current for L times to the first processor through the first bit line;
   wherein the first processor comprises an analog-to-digital converter, a digital computing circuit and a voltage clamping circuit; the voltage clamping circuit is connected with the first bit line, and the voltage clamping circuit is configured to fix a voltage of first bit line at a bias voltage; the analog-to-digital converter is configured to receive the L first output currents through the voltage clamping circuit; the analog-to-digital converter is configured to convert the L first output currents into L output data; and the digital computing circuit is configured to generate a first neuron value of a second layer according to the L output data.

10. The control circuit as claimed in claim 9, wherein the voltage clamping circuit comprises:
   a control transistor, wherein a first drain/source terminal of the control transistor is connected with the first bit line, and a second drain/source terminal of the control transistor is connected with an input terminal of the analog-to-digital converter; and an operation amplifier, wherein a positive input terminal of the operation amplifier receives the bias voltage, a negative input terminal of the operation amplifier is connected with the first drain/source terminal of the control transistor, an output terminal of the operation amplifier is connected with a gate terminal of the control transistor.

11. The control circuit as claimed in claim 9, wherein the digital computing circuit comprises:

an adder, wherein a first input terminal of the adder receives the output data; and a shift register, wherein an input terminal of the shift register is connected with an output terminal of the adder, and an output terminal of the shift register is connected with a second input terminal of the adder, wherein the output terminal of the adder generates an accumulated value to the shift register, wherein after the accumulated value is shifted for one bit by the shift register, a shifted data a is generated and inputted into the second input terminal of the adder.

12. The control circuit as claimed in claim 11, wherein after the adder receives the L output data, the accumulated value is the first neuron value of the second layer.

13. The control circuit as claimed in claim 9, wherein the output data is a L-bit output data, and the digital computing circuit comprises:

a L-bit adder, wherein a first input terminal of the L-bit adder receives the L-bit output data, a second input terminal of the L-bit adder receives a L-bit registered data, and an output terminal of the L-bit adder generates a (L+1)-bit accumulated data; and a L-bit register, wherein an input terminal of the L-bit register is connected with the output terminal of the L-bit adder to receive a first L bits of the (L+1)-bit accumulated data as the L-bit registered data, and an output terminal of the L-bit register generates the L-bit registered data.

14. The control circuit as claimed in claim 13, wherein after the adder receives the L output data, a second L bits of (L+1)-bit accumulated data is outputted to be the first neuron value of the second layer.

* * * * *